United States Patent
Luo et al.

(10) Patent No.: US 10,564,469 B2
(45) Date of Patent: Feb. 18, 2020

(54) LIQUID CRYSTAL DISPLAY DEVICE HAVING WIRE GRID POLARIZER AND #TWO DISPLAY STRUCTURES AND METHOD OF FORMING THE SAME

(71) Applicant: a.u. Vista, Inc., Irvine, CA (US)

(72) Inventors: Fang-Chen Luo, Milpitas, CA (US); Seok-Lyul Lee, Hsin-chu (TW)

(73) Assignee: A.U. VISTA, INC., Irvine, CA (US)

(*) Notice: Subject to any disclaimer, the term of this patent is extended or adjusted under 35 U.S.C. 154(b) by 0 days.

(21) Appl. No.: 15/925,024

(22) Filed: Mar. 19, 2018

(65) Prior Publication Data
US 2019/0285936 A1    Sep. 19, 2019

(51) Int. Cl.
G02F 1/1335    (2006.01)
G02B 5/30      (2006.01)
G02F 1/1362    (2006.01)
H01L 27/12     (2006.01)
G02F 1/1368    (2006.01)

(52) U.S. Cl.
CPC ..... *G02F 1/133528* (2013.01); *G02B 5/3058* (2013.01); *G02F 1/1368* (2013.01); *G02F 1/133512* (2013.01); *G02F 1/133514* (2013.01); *G02F 1/136286* (2013.01); *H01L 27/124* (2013.01); *G02F 2001/133548* (2013.01); *G02F 2001/133565* (2013.01); *G02F 2201/121* (2013.01); *G02F 2201/123* (2013.01)

(58) Field of Classification Search
CPC combination set(s) only.
See application file for complete search history.

(56) References Cited

U.S. PATENT DOCUMENTS

| | | |
|---|---|---|
| 5,342,545 A | 8/1994 | Yamada et al. |
| 5,528,401 A | 6/1996 | Narutaki et al. |
| 6,184,951 B1* | 2/2001 | Harrold ............... G02F 1/13473 349/117 |
| 6,211,931 B1 | 4/2001 | Fukao et al. |
| 2015/0185562 A1* | 7/2015 | Baek ................. G02F 1/133536 349/33 |
| 2016/0041435 A1* | 2/2016 | Park .................. G02F 1/134309 349/33 |
| 2016/0357063 A1* | 12/2016 | Liu ....................... G02B 5/3058 |

FOREIGN PATENT DOCUMENTS

CN    106932952 A    7/2017

* cited by examiner

*Primary Examiner* — Lauren Nguyen
(74) *Attorney, Agent, or Firm* — Tim Tingkang Xia, Esq.; Locke Lord LLP

(57) ABSTRACT

A display cell structure is provided. A first substrate and a second substrate are spaced apart from each other, and a wire grid polarizer layer is disposed therebetween, forming a first cell gap between the first substrate and the wire grid polarizer layer and a second cell gap between the second substrate and the wire grid polarizer layer. A first display structure is disposed in the first cell gap, and includes multiple first pixel electrodes and a polymer liquid crystal layer. A polarizer layer is disposed on the second substrate and facing an opposite side to the wire grid polarizer layer. A second display structure is disposed in the second cell gap, and includes multiple second pixel electrodes and a liquid crystal layer.

16 Claims, 14 Drawing Sheets

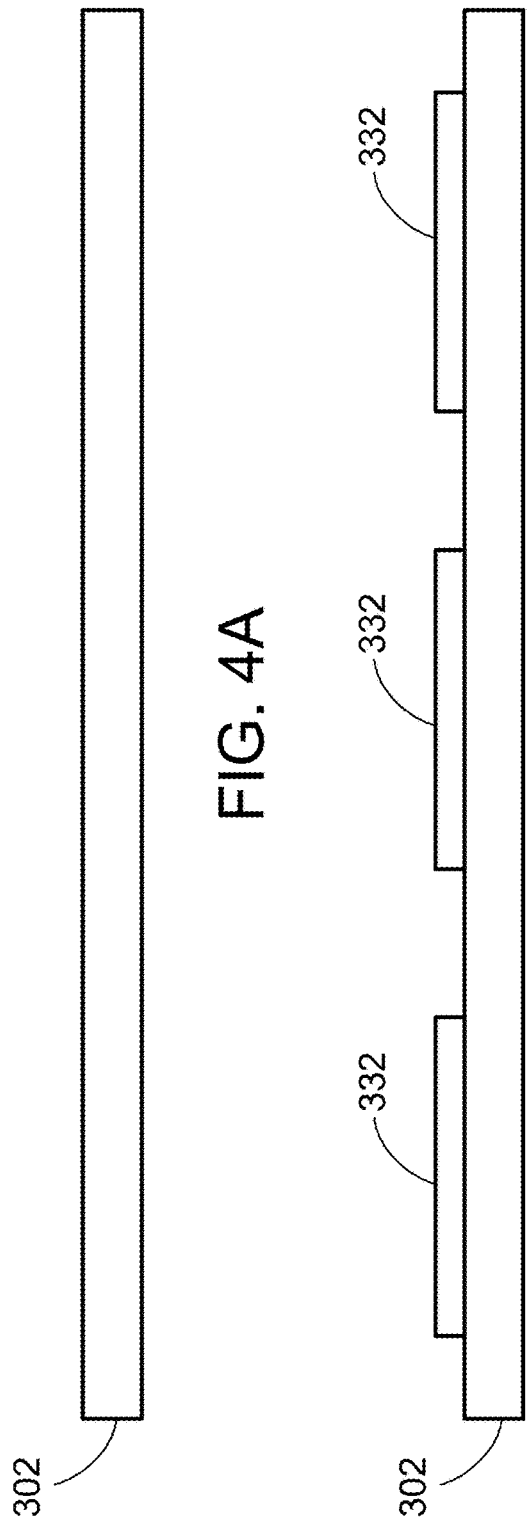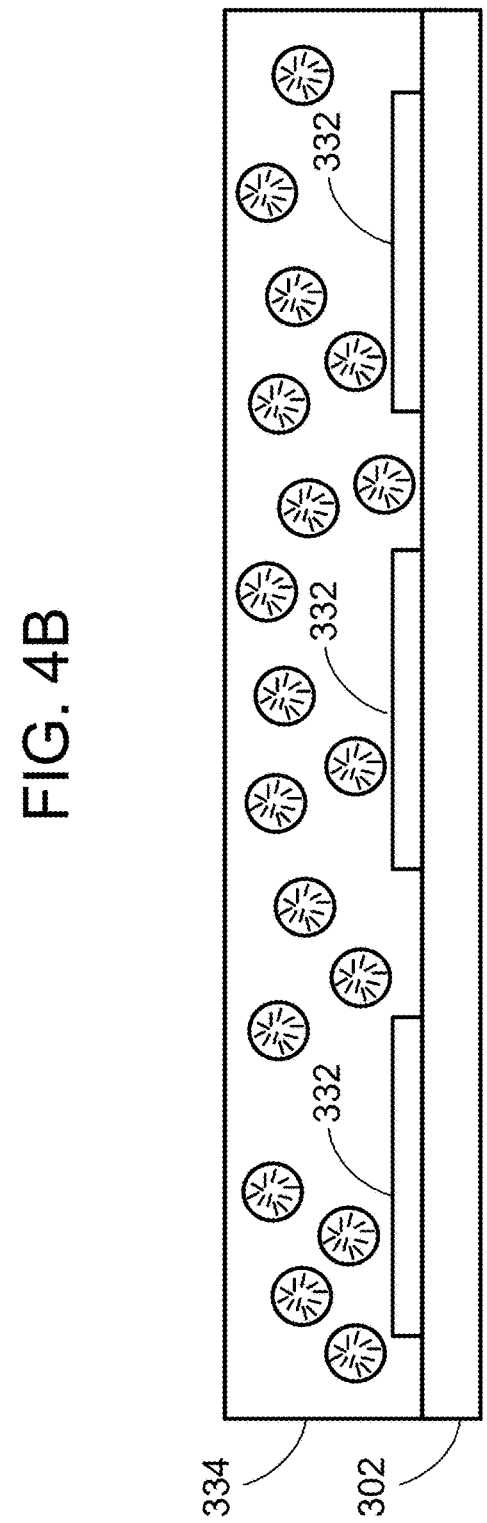

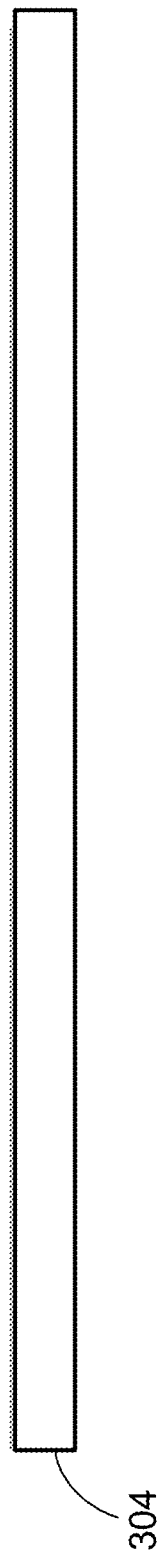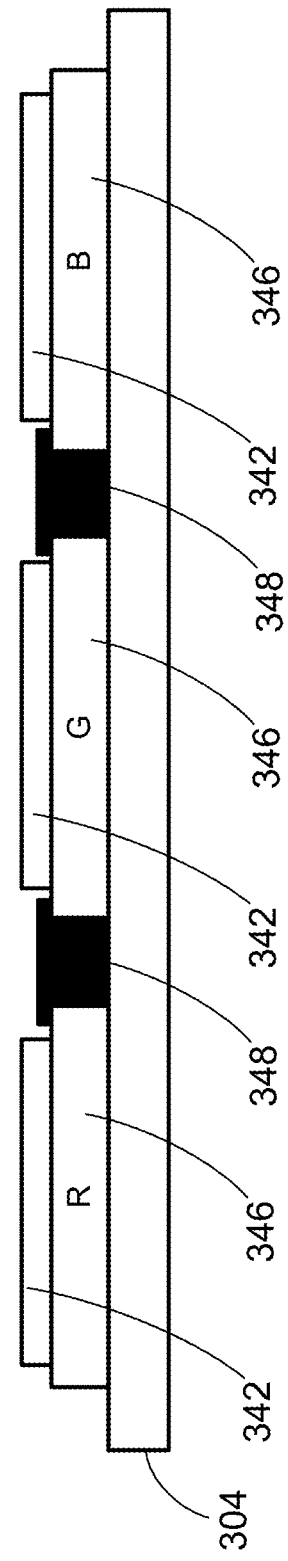

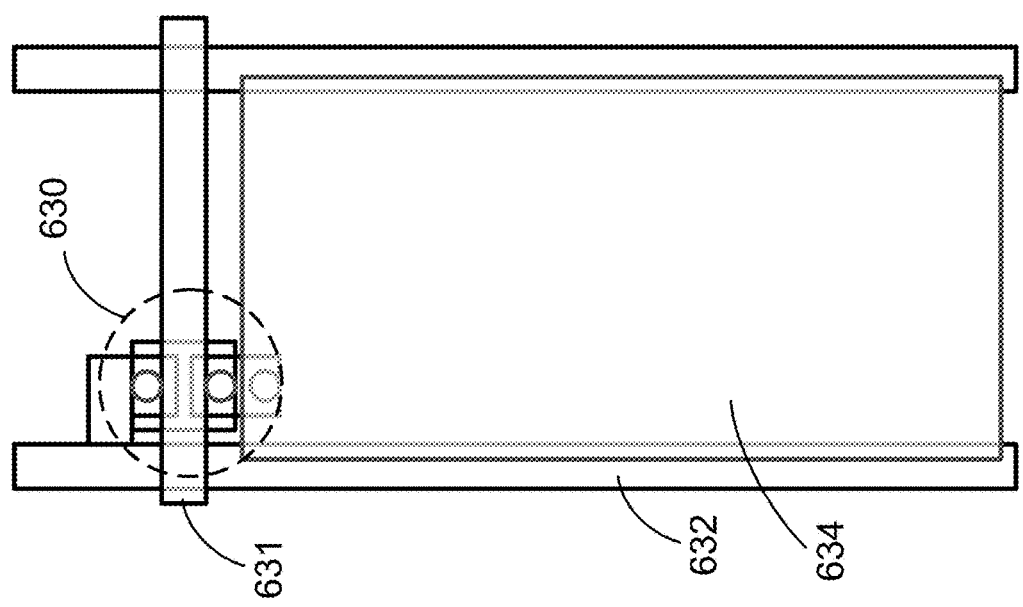

LIQUID CRYSTAL DISPLAY DEVICE HAVING WIRE GRID POLARIZER AND #TWO DISPLAY STRUCTURES AND METHOD OF FORMING THE SAME

FIELD

The disclosure relates generally to display technology, and more particularly to a compact high dynamic contrast liquid crystal display device and a method of forming the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An active matrix liquid crystal display (AMLCD) has achieved a wide viewing angle, fast response time and high color gamma and contrast ratio up to several thousand to 1. However, in order to compete with active matrix OLEDs (AMOLEDs), which have a black dark state in the market, there is a need to improve the dynamic contrast ratio of the AMLCD.

Currently, a dual-cell LCD cell structure has been proposed to enhance the dynamic contrast of a LCD. The dual-cell LCD cell structure has two liquid crystal cells, including one as a regular AMLCD cell, and the other as a light shutter cell, which enhances the contrast of the display. However, the panel has two cells, and each cell requires two glass substrates, thus resulting in a total of four glass substrates for the entire LCD cell structure, which is bulky, heavy and expensive.

Therefore, a heretofore unaddressed need exists in the art to address the aforementioned deficiencies and inadequacies.

SUMMARY

One aspect of the disclosure relates to a display cell structure, which includes: a first substrate and a second substrate spaced apart from each other; a wire grid polarizer layer disposed between the first substrate and the second substrate, forming a first cell gap between the first substrate and the wire grid polarizer layer and a second cell gap between the second substrate and the wire grid polarizer layer; a first display structure disposed in the first cell gap between the first substrate and the wire grid polarizer layer, the first display structure comprising: a plurality of first pixel electrodes disposed on the first substrate and facing the wire grid polarizer layer; and a polymer liquid crystal layer disposed in the first cell gap between the first substrate and the wire grid polarizer layer; a polarizer layer disposed on the second substrate and facing an opposite side to the wire grid polarizer layer; and a second display structure disposed in the second cell gap between the second substrate and the wire grid polarizer layer, the second display structure comprising: a plurality of second pixel electrodes disposed on the second substrate and facing the wire grid polarizer layer; and a liquid crystal layer disposed in the second cell gap between the second substrate and the wire grid polarizer layer.

In certain embodiments, the display cell structure further includes a common electrode layer formed by indium tin oxide and disposed between the first substrate and the second substrate, wherein the wire grid polarizer layer is disposed on the common electrode layer and facing the second display structure.

In certain embodiments, the wire grid polarizer layer is formed by a low resistivity material to function as a common electrode, and the low resistivity material has an electrical resistivity smaller than $10^{-7}$ $\Omega \cdot m$.

In certain embodiments, the low resistivity material is selected from the group consisting of aluminum (Al), Molybdenum (Mo), Tungsten (W), or a combination thereof.

In certain embodiments, a thickness of the wire grid polarizer layer is about 80-120 nm.

In certain embodiments, a thickness of the liquid crystal layer of the second display structure is about 2-4 $\mu m$.

In certain embodiments, the second display structure is in a vertically-aligned (VA) mode or a twisted nematic (TN) mode.

In certain embodiments, the first display structure and the second display structure correspondingly define a plurality of pixels, and for each of the pixels, in a first operational mode, the first display structure is configured to switch to a transparent state, and in a second operational mode, the first display structure is configured to switch to a substantially opaque state.

In certain embodiments, for each of the pixels, in the first operational mode, the first pixel electrode corresponding to the pixel is provided with a voltage difference, such that the first display structure is configured to switch to the transparent state, and in the second operational mode, the first pixel electrode corresponding to the pixel is not provided with the voltage difference, such that the first display structure is configured to switch to the substantially opaque state.

In certain embodiments, the first display structure and the second display structure correspondingly define a plurality of pixels, and for each of the pixels, the second display structure comprises a plurality of color filters disposed on the second substrate, wherein each of the second pixel electrodes corresponds to one of the color filters to form a sub-pixel.

In certain embodiments, for each of the sub-pixels, the first display structure further comprises: a first transistor electrically connected to a corresponding one of the first pixel electrodes, each of the first transistors comprising: a first semiconductor layer disposed on the first substrate; a first gate insulating layer disposed on the first semiconductor layer; a first gate electrode disposed on the first gate insulating layer; a first source electrode and a first drain electrode disposed on the first semiconductor layer and insulated from the first gate electrode, wherein the first drain electrode is electrically connected to the corresponding one of the first pixel electrodes; and a first black matrix layer disposed between the first transistor and on the first substrate.

In certain embodiments, for each of the sub-pixels, the second display structure further comprises: a second transistor electrically connected to a corresponding one of the second pixel electrodes, each of the second transistors comprising: a second semiconductor layer disposed on the second substrate; a second gate insulating layer disposed on the second semiconductor layer; a second gate electrode disposed on the second gate insulating layer; a second source electrode and a second drain electrode disposed on the second semiconductor layer and insulated from the second gate electrode, wherein the second drain electrode is electrically connected to the corresponding one of the second pixel electrodes; and a second black matrix layer disposed between the second transistor and on the second substrate, and between the color filters.

In certain embodiments, the first display structure further comprises a plurality of reference electrodes disposed on the first substrate and facing the wire grid polarizer layer, and the first pixel electrodes and the reference electrodes are alternately disposed on the first substrate In a further aspect of the disclosure, a display device is provided, which includes a display cell structure as described above, and a backlight disposed at a side of the display cell structure to emit light toward the first display structure of the display cell structure.

In yet a further aspect of the disclosure, a display device is provided, which includes a display cell structure as described above, and a backlight disposed at a side of the display cell structure to emit light toward the second display structure of the display cell structure.

A further aspect of the disclosure relates to a method for forming a display cell structure, which includes: forming a first display structure of the display cell structure by: disposing a plurality of first pixel electrodes on a first substrate; disposing a polymer liquid crystal layer on the first substrate to cover the first pixel electrodes; and disposing a common electrode layer formed by indium tin oxide on the polymer liquid crystal layer; forming a wire grid polarizer layer on the common electrode layer; forming a second display structure of the display cell structure by: disposing a plurality of second pixel electrodes on a second substrate; and disposing the second substrate with the second pixel electrodes to face the wire grid polarizer layer, such that a liquid crystal layer is positioned between the second substrate and the wire grid polarizer layer.

In certain embodiments, the wire grid polarizer layer is formed by a low resistivity material to function as a common electrode for the display device, the low resistivity material has an electrical resistivity smaller than $10^{-7}$ $\Omega \cdot m$, and the low resistivity material is selected from the group consisting of aluminum (Al), Molybdenum (Mo), Tungsten (W), or a combination thereof.

In certain embodiments, each of the second pixel electrodes is aligned to one of the first pixel electrodes along a direction substantially perpendicular to the wire grid polarizer layer.

In certain embodiments, the method further includes: forming a polarizer layer on the second substrate and facing an opposite side to the wire grid polarizer layer.

In certain embodiments, the second display structure is in a vertically-aligned (VA) mode or a twisted nematic (TN) mode.

In certain embodiments, the method further includes: forming a plurality of color filters on the second substrate, wherein each of the second pixel electrodes corresponds to one of the color filters to form a sub-pixel.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 4A schematically shows a first substrate according to certain embodiments of the present disclosure.

FIG. 4B schematically shows a plurality of first pixel electrodes being disposed on the first substrate of FIG. 4A according to certain embodiments of the present disclosure.

FIG. 4C schematically shows a polymer liquid crystal layer being disposed on the structure of FIG. 4B according to certain embodiments of the present disclosure.

FIG. 4F schematically shows a second substrate according to certain embodiments of the present disclosure.

FIG. 4G schematically shows a plurality of color filters, a plurality of second pixel electrodes, and a plurality of black matrix structures being disposed on the second substrate of FIG. 4F according to certain embodiments of the present disclosure.

FIG. 6A schematically shows a bottom view of a pixel structure of the first display structure according to certain embodiments of the present disclosure.

DETAILED DESCRIPTION OF THE DISCLOSURE

Figure 1:
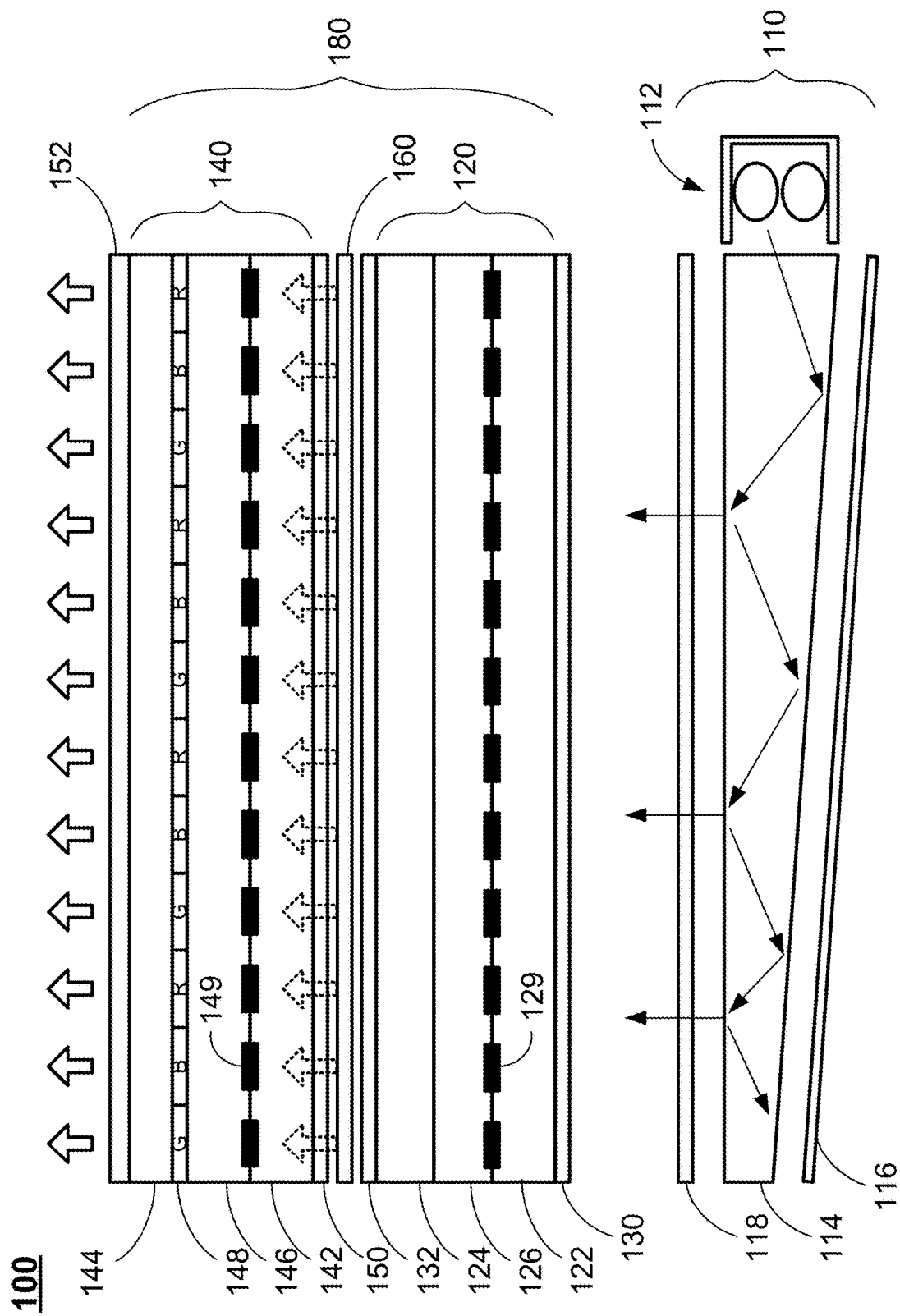
FIG. 1 schematically shows a display device according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a compact high dynamic contrast liquid crystal display device and a method of forming the same.

Certain aspects of the disclosure relates to a display cell structure, which utilizes a polymerized liquid crystal film to replace the shutter cell of the dual-cell LCD cell structure. Specifically, the polymerized liquid crystal film is integrated with a regular liquid crystal panel to form the display cell structure. The new structure achieves enhanced contrast ratio with significantly reduced weight, volume and cost.

FIG. 1 schematically shows a display device according to certain embodiments of the present disclosure. As shown in FIG. 1, the display device 100 includes a backlight module 110 and a display cell structure 180. The backlight module 110 is used to emit light toward the display cell structure 180, which includes a light source 112, a light guide plate 114, a reflection sheet 116 and a diffusion film 118. The display cell structure 180 is a dual-cell structure, which includes two liquid crystal cells 120 and 140, and a diffusion film 160 is disposed between the two liquid crystal cells 120 and 140. Specifically, the liquid crystal cell 120 functions as a light shutter cell, which includes two substrates 122 and 124, a liquid crystal layer 126 disposed between the two substrates 122 and 124, and a plurality of thin-film transistors (TFTs) 129. Further, two polarizer layers 130 and 132 are formed on the outer sides of the two substrates 122 and 124. The liquid crystal cell 140 functions as a display cell, which includes two substrates 142 and 144, a liquid crystal layer 146 disposed between the two substrates 142 and 144, a color filter layer 148 disposed on the top substrate 144, and a plurality of TFT's 149 disposed on the bottom substrate 142. The color filter layer 148 include a plurality of color filters, such as the RGB color filters, which include red (R), green (G) and blue (B) color filters. Further, a polarizer layer 150 is formed on the outer side of the bottom substrate 142, and a polarizer film 152 is formed on the outer side of the top substrate 144. Specifically, each of the two liquid crystal cells 120 and 140 correspondingly defines a plurality of sub-pixels. For the liquid crystal cell 120, each sub-pixel has one TFT 129. For the liquid crystal cell 140, each sub-pixel has one TFT 149, and one of the color filters in the color filter layer 148. In certain embodiments, the display cell structure 180 may further include other components not shown in FIG. 1, such as drivers and lines connecting the electrodes of the TFTs to the drivers.

As shown in FIG. 1, when the light source 112 is turned on, the light emitted by the light source 112 (shown in arrows in FIG. 1) is guided in the light guide plate 114 and reflected by the reflection sheet 116 toward the display cell structure 180. When the light enters the display cell structure 180, at the liquid crystal cell 120 (which functions as the light shutter cell), the TFT 129 of each sub-pixel is provided with an electric field to control the orientations of the liquid crystal molecules of the liquid crystal layer 126 in the sub-pixel, such that the light either is blocked by the liquid crystal layer 126, or passes through the liquid crystal layer 126 toward the liquid crystal cell 140. At the liquid crystal cell 140 (which functions as the display cell), the TFT 149 of each sub-pixel is provided with an electric field to control the orientations of the liquid crystal molecules of the liquid crystal layer 146 in the sub-pixel, such that the light entering the sub-pixel passes through the liquid crystal layer 146 and the corresponding color filter in the color filter layer 148 to display a desired color.

As discussed above, in the display device 100 as shown in FIG. 1, each of the liquid crystal cells 120 and 140 requires two glass substrates, thus resulting in a total of four substrates for the entire LCD cell structure of the display device 100. In order to solve such deficiency, a liquid crystal display cell structure is proposed to replace the dual-cell LCD cell structure.

Figure 2:
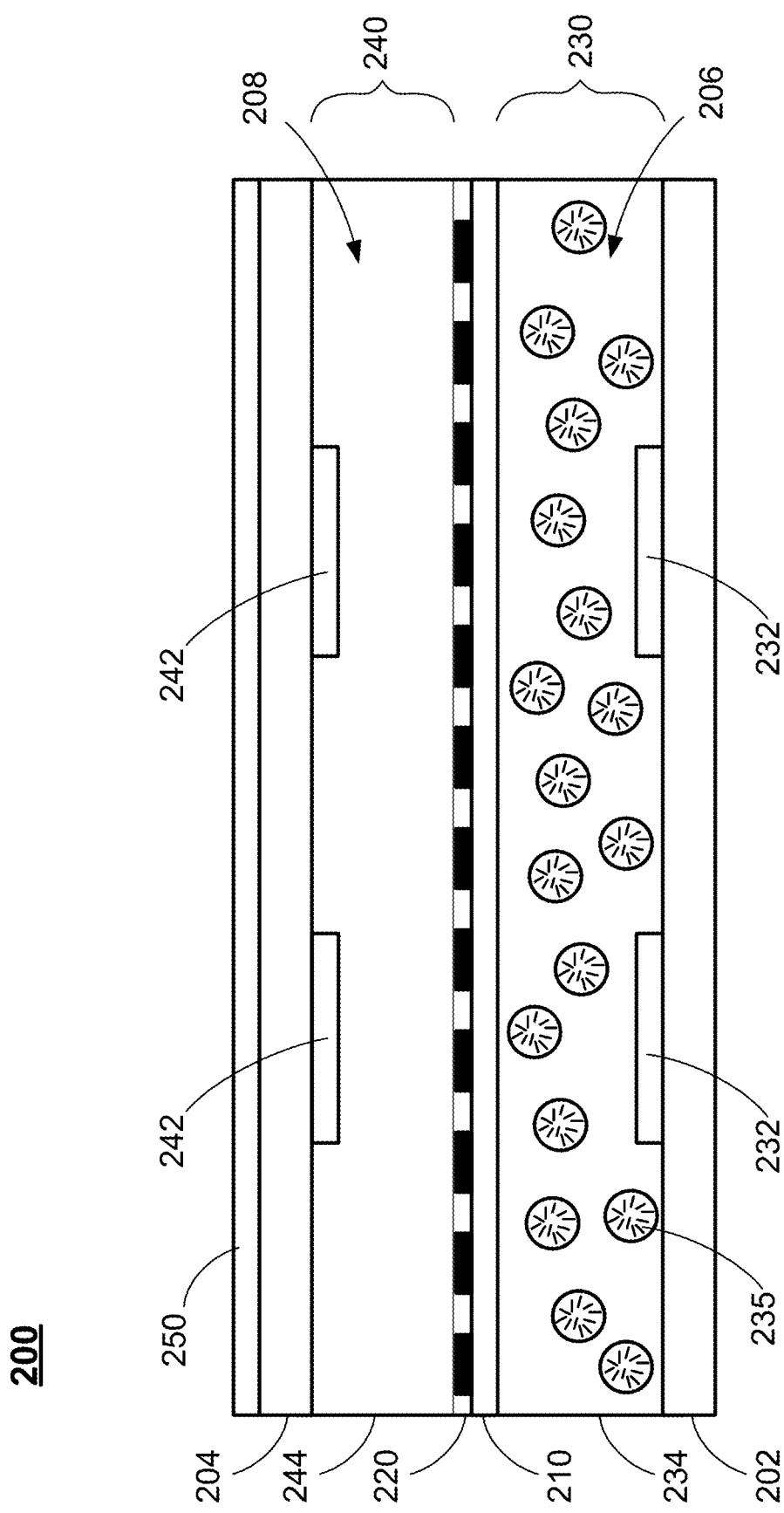
FIG. 2 schematically shows a display cell structure according to certain embodiments of the present disclosure.

FIG. 2 schematically shows a display cell structure according to certain embodiments of the present disclosure. Specifically, the display cell structure 200 as shown in FIG. 2 may be used to replace the display cell structure 180 as shown in FIG. 1. In other words, the display cell structure 200 as shown in FIG. 2 may be combined with the backlight module 110 as shown in FIG. 1 to form a display device.

As shown in FIG. 2, the display cell structure 200 includes a first substrate 202 and a second substrate 204, which are spaced apart from each other. A common electrode layer 210 and a wire grid polarizer layer 220 are disposed between the first substrate 202 and the second substrate 204, dividing the space between the first substrate 202 and the second substrate 204 into two parts. Specifically, the wire grid polarizer layer 220 is disposed on the common electrode layer 210 and facing the second substrate 204. In certain embodiments, the common electrode layer 210 is a thin layer. Further, a polarizer layer 250 is disposed on the second substrate 204 and facing an opposite side to the common electrode layer 210 and the wire grid polarizer layer 220. The space between the first substrate 202 and the common electrode layer 210 forms a first cell gap 206, which is provided for a first display structure 230. As described above, the common electrode layer 210 can be a thin layer, such that a distance between the first substrate 202 and the common electrode layer 210 is substantially equal to the distance between the first substrate 202 and the wire grid polarizer layer 220. In other words, the first cell gap 206 may be defined as the space between the first substrate 202 and the wire grid polarizer layer 220. The space between the second substrate 204 and the wire grid polarizer layer 220 forms a second cell gap 208, which is provided for a second display structure 240. In certain embodiments, the first display structure 230 functions as a light shutter section, which includes a plurality of first pixel electrodes 232 and a polymer liquid crystal layer 234. The first pixel electrodes 232 are disposed on the first substrate 202 to face the common electrode layer 210 and the wire grid polarizer layer 220, and the polymer liquid crystal layer 234 is disposed in the first cell gap 206. The second display structure 240 functions as a display section, which includes a plurality of second pixel electrodes 242 and a liquid crystal layer 244. The second pixel electrodes 242 are disposed on the second substrate 204 to face the common electrode layer 210 and the wire grid polarizer layer 220, and the liquid crystal layer 244 is disposed in the second cell gap 208. In this embodiment, as shown in FIG. 2, each of the second pixel electrodes 242 is aligned to one of the first pixel electrodes 232 along a direction substantially perpendicular to the wire grid polarizer layer 220 (which is the vertical direction as shown in FIG. 2). In certain embodiments, the second pixel electrodes 242 do not need to be aligned to the first pixel electrodes 232.

In certain embodiments, the first display structure 230 and the second display structure 240 correspondingly define a plurality of pixels, and each pixel includes one of the first pixel electrodes 232 and one of the second pixel electrodes 242. Specifically, the first display structure 230 functions as the light shutter section, and the second display structure 240 functions as the display section. In certain embodiments, for each of the pixels, the second pixel electrode 242 corresponding to the pixel may be provided with a voltage difference from the common electrode layer 210 (or in some cases not provided with the voltage difference), such that the voltage difference between the second pixel electrode 242 and the common electrode layer 210 forms an electric field (or, in the case where no voltage difference is applied, no electric field is formed) to control the orientation of the liquid crystal molecules of the liquid crystal layer 244, which regulates the light entering the second display structure 240 to pass through the second display structure 240 corresponding to the pixel. On the other hand, the first pixel electrode 232 corresponding to the same pixel may be provided with a voltage difference from the common electrode layer 210 (or in some cases not provided with the voltage difference), such that the voltage difference between the first pixel electrode 232 and the common electrode layer 210 forms an electric field (or, in the case where no voltage difference is applied, no electric field is formed) to control the orientation of the polymer liquid crystal molecules of the polymer liquid crystal layer 234, such that the polymer liquid crystal layer 234 may be switchable between two operational modes to either allow the light entering the first display structure 230 to pass through the first display structure 230 or block the light from passing through the first display structure 230. In certain embodiments, when a backlight module (not shown in FIG. 2) is provided at a bottom side of the display cell structure 200, the light emitted by the backlight module (not shown in FIG. 2) may enter the first display structure 230, and based on the operation modes of the polymer liquid crystal layer 234, the light may pass through the first display structure 230 or be blocked by the first display structure 230. If the light passes through the first display structure 230, the light may enter the second display structure 240, and is regulated by the orientation of the liquid crystal molecules of the liquid crystal layer 244 to pass through the second display structure 240.

In certain embodiments, the two operational modes of the first display structure 230 may include a first operational mode and a second operational mode. In the first operational mode, the first display structure 230 is configured to switch to a transparent state, such that the light may pass through the first display structure 230 without scattering or being blocked. In the second operational mode, the first display structure 230 is configured to switch to a substantially opaque state, which does not allow the light to pass through the first display structure 230.

In certain embodiments, the polymer liquid crystal layer 234 of the first display structure 230 may be implemented by different liquid crystal molecules 235, and the definition of the "substantially opaque state" of the first display structure 230 may be correspondingly different. For example, the polymer liquid crystal layer 234 of the first display structure 230 may include polymer-networked liquid crystal (PNLC) molecules or polymer-dispersed liquid crystal (PDLC) molecules, which may be dissolved or dispersed into a liquid polymer followed by solidification or curing of the polymer. In certain embodiments, the drop size of all of the liquid crystal molecules 235 (which may be the PNLC molecules or the PDLC molecules) may be substantially uniform, with a standard deviation being less than 20%. During the change of the polymer from a liquid to solid, the liquid crystals become incompatible with the solid polymer and form droplets throughout the solid polymer. Thus, when a voltage difference is provided by the first pixel electrode 232 to form an electric field, the orientation of the molecules of the PNLC molecules or the PDLC molecules of the polymer liquid crystal layer 234 may be controlled by the electric field, such that light is allowed to pass through the first display structure 230 without scattering. In other words, when a voltage difference is provided by the first pixel electrode 232 to form an electric field, the first display structure 230 is switched to the transparent state. On the other hand, when no voltage difference is provided by the first pixel electrode 232, the PNLC molecules or the PDLC molecules of the polymer liquid crystal layer 234 are randomly arranged, which results in scattering of light as the light passes through the first display structure 234. This results in a translucent, "milky white" appearance of the first display structure 234. In other words, when the first pixel electrode 232 is not provided with the voltage difference, the first display structure 230 is switched to the "substantially opaque state."

It should be noted that the degree of transparency of the PNLC molecules or the PDLC molecules of the polymer liquid crystal layer 234 in the "substantially opaque state" may can be controlled by the applied voltage difference. In certain embodiments, for example, the "substantially opaque state" can be a non-transparent state, where the polymer liquid crystal layer 234 becomes substantially non-transparent, and light will be blocked from passing through the first display structure 234 when the first display structure 234 is switched to the substantially opaque state. In certain embodiments, the "substantially opaque state" can be a milky white state (which is not totally non-transparent), where the polymer liquid crystal layer 234 becomes translucent (or "milky white") when the first display structure 234 is switched to the substantially opaque state, and light will be scattered (and thus substantially blocked) in the first display structure 234.

In certain embodiments, the common electrode layer 210 can be formed by indium tin oxide or other suitable materials. In certain embodiments, a thickness of the wire grid polarizer layer 220 can be 80-120 nm. For example, the thickness of the wire grid polarizer layer 220 can be 100 nm. In certain embodiments, a thickness of the liquid crystal layer 244 of the second display structure 240 (which functions as the display section) can be 2-4 μm. For example, the thickness of the liquid crystal layer 244 can be 3 μm. In certain embodiments, the second display structure 240 (which functions as the display section) can be in a vertically-aligned (VA) mode or a twisted nematic (TN) mode.

In the display cell structure 200 as shown in FIG. 2, only two substrates 202 and 204 are provided (instead of four substrates as shown in FIG. 1), which makes the display cell structure 200 much lighter and cheaper. Further, the contrast ratio of the display cell structure 200 is the multiple of the contrast ratios of the first display structure 230 (i.e., the light shutter section) and the second display structure 240 (i.e., the display section), which allows the total contrast ratio of the display cell structure 200 to be greatly enhanced.

Figure 3:
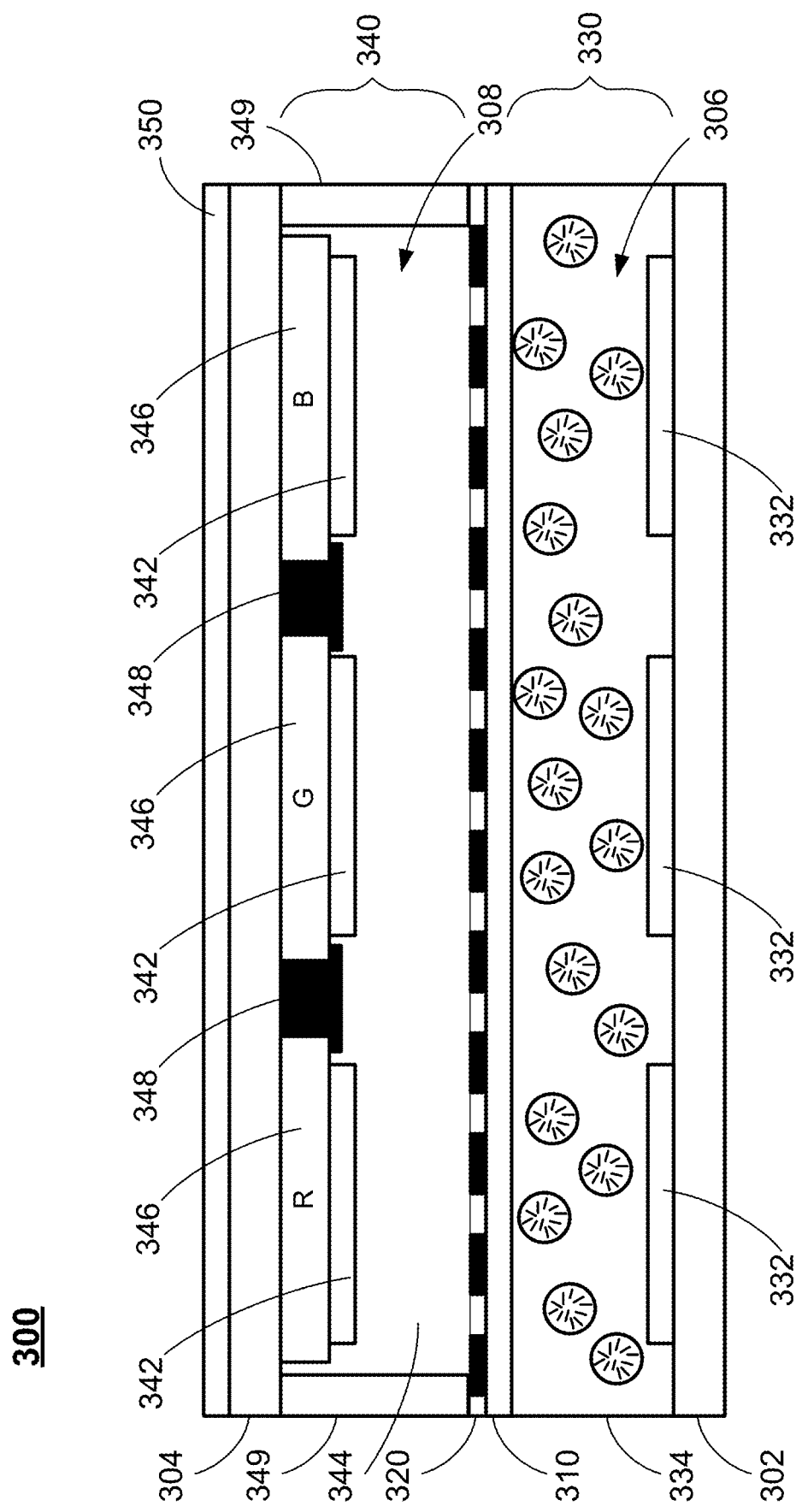
FIG. 3 schematically shows a display cell structure according to certain embodiments of the present disclosure.

FIG. 3 schematically shows a display cell structure according to certain embodiments of the present disclosure. Specifically, the display cell structure 300 as shown in FIG. 3 may also be used to replace the display cell structure as shown in FIG. 1. In other words, the display cell structure 300 as shown in FIG. 3 may be combined with the backlight module 110 as shown in FIG. 1 to form a display device.

As shown in FIG. 3, the display cell structure 300 includes a first substrate 302 and a second substrate 304, which are spaced apart from each other. A common electrode layer 310 and a wire grid polarizer layer 320 are disposed between the first substrate 302 and the second substrate 304, dividing the space between the first substrate 302 and the second substrate 304 into two parts. Specifically, the wire grid polarizer layer 320 is disposed on the common electrode layer 310 and facing the second substrate 304. Further, a polarizer layer 350 is disposed on the second substrate 204 and facing an opposite side to the common electrode layer 310 and the wire grid polarizer layer 320. The space between the first substrate 302 and the common electrode layer 310 forms a first cell gap 306, which is provided for a first display structure 330. The space between the second substrate 304 and the wire grid polarizer layer 320 forms a second cell gap 308, which is provided for a second display structure 340. In certain embodiments, the first display structure 330 functions as a light shutter section, which includes a plurality of first pixel electrodes 332 and a polymer liquid crystal layer 334. The first pixel electrodes 332 are disposed on the first substrate 302 to face the common electrode layer 310 and the wire grid polarizer layer 320, and the polymer liquid crystal layer 334 is disposed in the first cell gap 306. The second display structure 340 functions as a display section, which includes a plurality of second pixel electrodes 342, a liquid crystal layer 344, and a plurality of color filters 346. The color filters 346 are disposed on the second substrate 304 to face the common electrode layer 310 and the wire grid polarizer layer 320, and a plurality of black matrix structures 348 may be disposed between the second pixel electrodes 342 and between the color filters 346. The second pixel electrodes 342 are disposed on the color filters 346, and each second pixel electrode 342 corresponds to one of the color filters 346, thus forming a sub-pixel. As shown in FIG. 3, one pixel of the display cell structure 300 is provided, which includes three sub-pixels, corresponding to the red (R), green (G) and blue (B) color filters 346. The liquid crystal layer 344 is disposed in the second cell gap 308. Further, in the second display structure 340, a plurality of photo spacers 349 are provided between the second substrate 304 and the wire grid polarizer layer 320. It should be noted that only the second display structure 340 is provided with the photo spacers 349, and there is no photo spacer provided in the first display structure 330. In this embodiment, as shown in FIG. 3, each of the second pixel electrodes 342 is aligned to one of the first pixel electrodes 332 along a direction substantially perpendicular to the wire grid polarizer layer 320 (which is the vertical direction as shown in FIG. 3). In certain embodiments, the second pixel electrodes 342 do not need to be aligned to the first pixel electrodes 332. In particular, the differences between the display cell structure 300 as shown in FIG. 3 and the display cell structure 200 as shown in FIG. 2 exist in that, in the display cell structure 300, the second display structure 340 has the color filters 346 (as well as the black matrix structures 348 and the photo spacers 349), and the number of first and second pixel electrodes are different in the two display cell structures. Other corresponding structures or components of the two display cell structures are similar to each other. Therefore, details of the similar structures of the display cell structure 300 are not elaborated herein.

FIGS. 4A-4I schematically show a method of forming a display cell structure according to certain embodiments of the present disclosure. In certain embodiments, the method as shown in FIGS. 4A-4I may be used to form a display cell structure as shown in FIG. 3. It should be particularly noted that, unless otherwise stated in the present disclosure, the steps of the method as shown in FIGS. 4A-4I may be arranged in a different sequential order, and are thus not limited to the sequential order as shown in FIGS. 4A-4I.

Figure 4D:
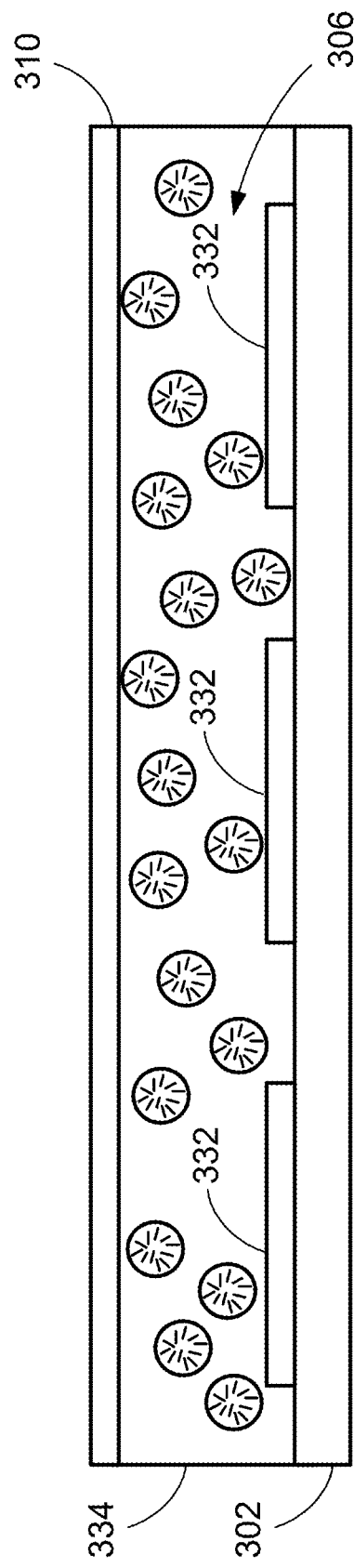
FIG. 4D schematically shows a common electrode layer being disposed on the structure of FIG. 4C according to certain embodiments of the present disclosure.
Figure 4E:
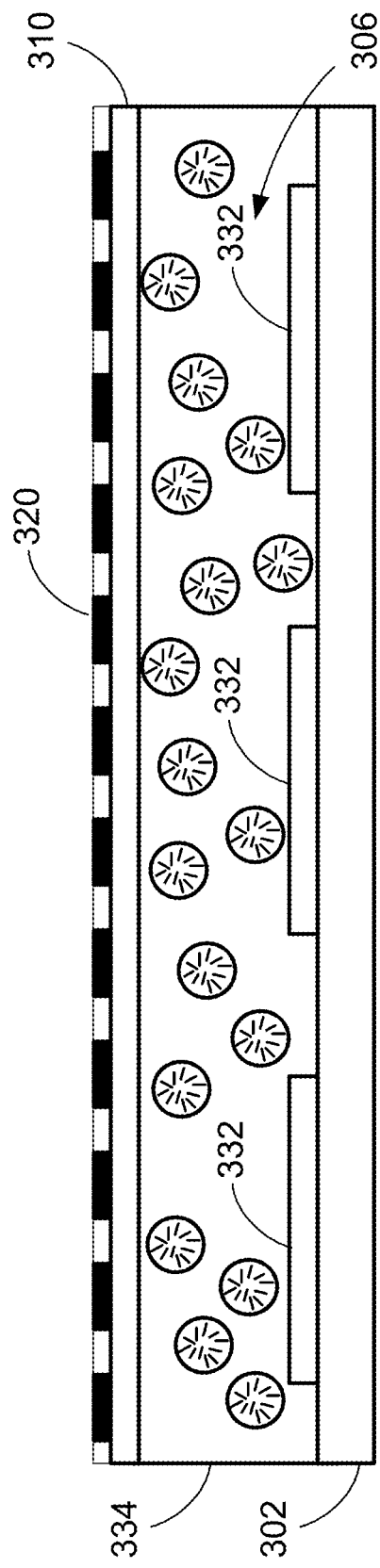
FIG. 4E schematically shows a wire grid polarizer layer being disposed on the structure of FIG. 4D according to certain embodiments of the present disclosure.

FIGS. 4A-4E show the process of forming a bottom structure of the display cell structure 300. As shown in FIG. 4A, a first substrate 302 is provided. As shown in FIG. 4B, a plurality of first pixel electrodes 332 are disposed on the first substrate 302. As shown in FIG. 4C, a polymer liquid crystal layer 334 is disposed on the first substrate 302 to cover the first pixel electrodes 332. As shown in FIG. 4D, a common electrode layer 310 is disposed on the polymer liquid crystal layer 334. As shown in FIG. 4E, a wire grid polarizer layer 320 is formed on the common electrode layer 310, thus forming the bottom structure of the display cell structure 300 (including the first substrate 302, the common electrode layer 310, the wire grid polarizer layer 320, and the first display cell 330 in the first cell gap 306 between the first substrate 302 and the common electrode layer 310).

FIGS. 4F and 4G show the process of forming a top structure of the display cell structure 300. As shown in FIG. 4F, a second substrate 304 is provided. As shown in FIG. 4G, the color filters 346, the second pixel electrodes 342 and the black matrix structures 348 are respectively formed on the second substrate 304, thus forming the top structure of the display cell structure 300.

Figure 4H:
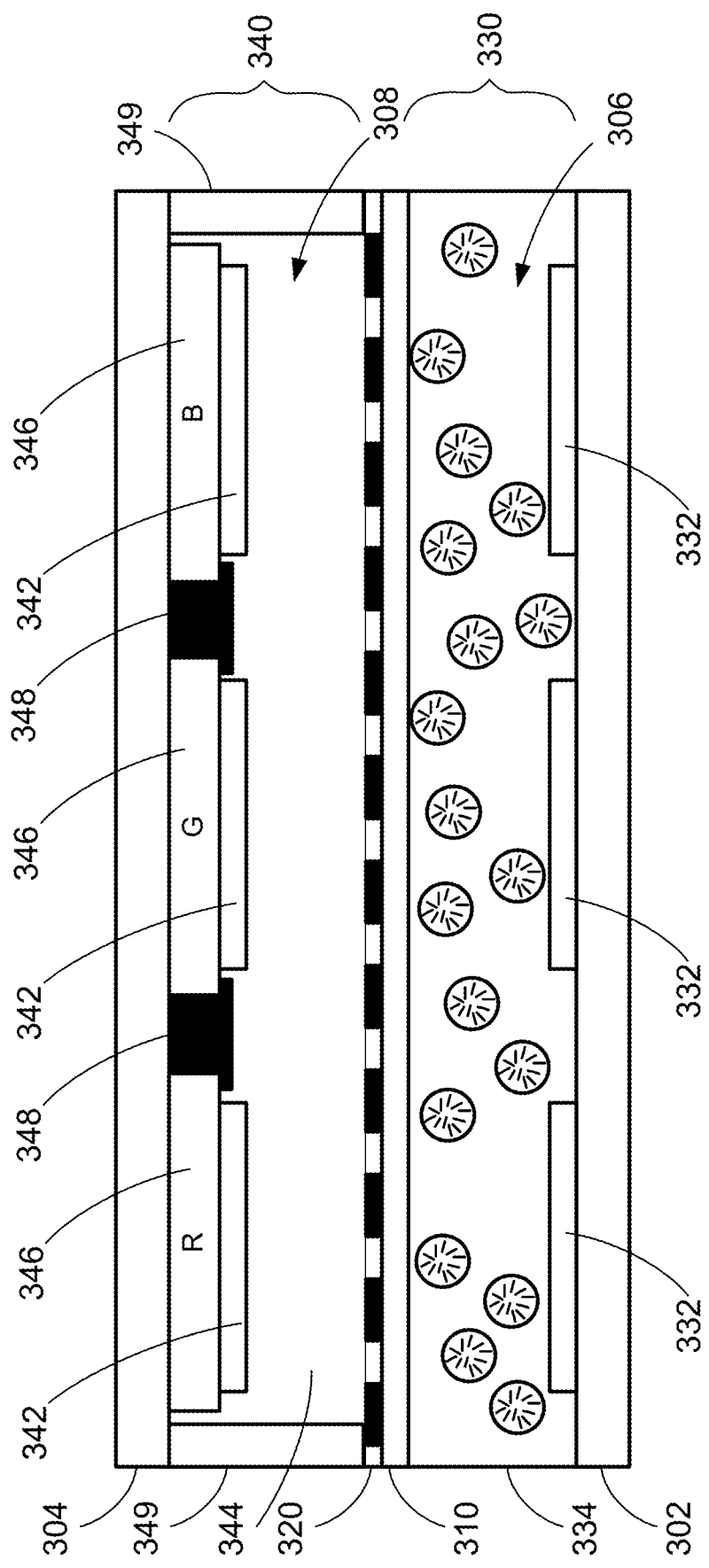
FIG. 4H schematically shows an assembly of the structure of FIG. 4E and the structure of FIG. 4G according to certain embodiments of the present disclosure.
Figure 4I:
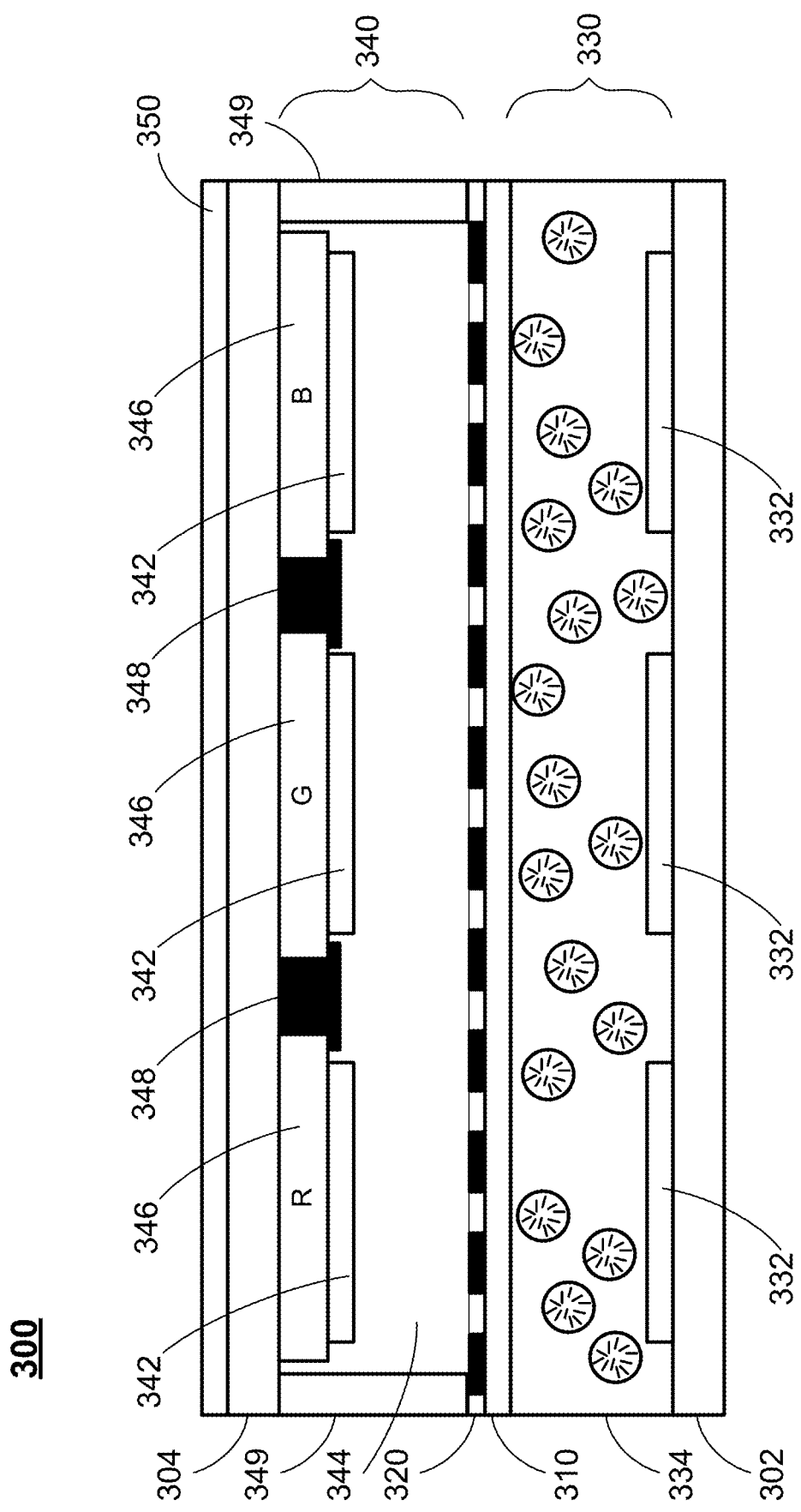
FIG. 4I schematically shows a polarizer layer being disposed at the bottom of the structure of FIG. 4H according to certain embodiments of the present disclosure.

Once the top and bottom structures of the display cell structure 300 are formed, the two structures can be assembled together, as shown in FIGS. 4H and 4I. As shown in FIG. 4H, the top structure as shown in FIG. 4G is inversed on top of the bottom structure as shown in FIG. 4E, and aligned with the bottom structure, such that the first pixel electrodes 332 and the second pixel electrodes 342 are correspondingly aligned to form the sub-pixels. Then, the photo spacers 349 are added between the top structure and the bottom structure, thus forming the second cell gap 308 between the top structure and the bottom structure, and liquid crystal molecules may be filled in the second cell gap 308 to form the liquid crystal layer 344. Finally, as shown in FIG. 4I, a polarizer layer 350 is disposed on the top side of the second substrate 304, thus completing the assembly of the display cell structure 300.

Figure 5:
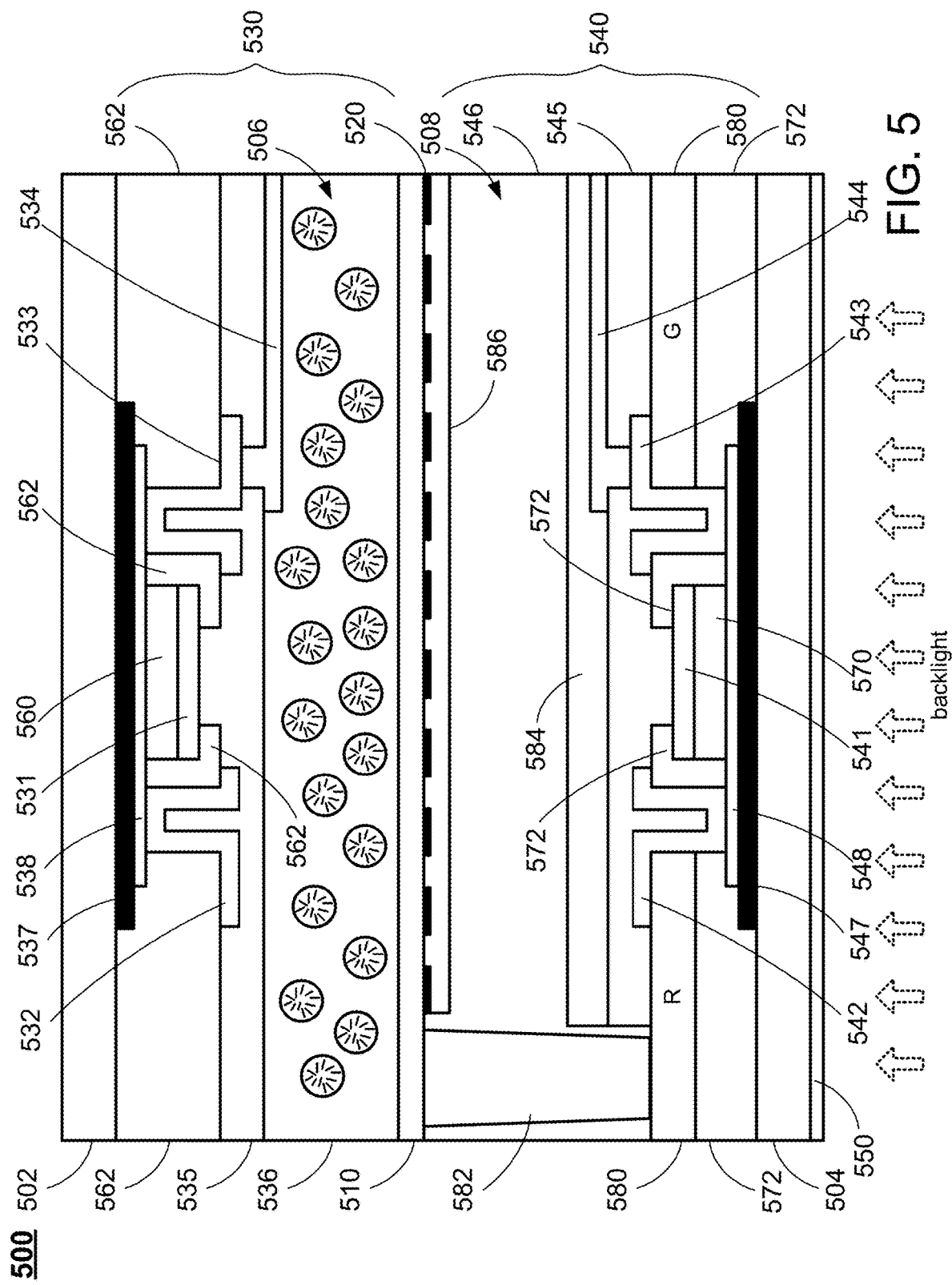
FIG. 5 schematically shows a display cell structure according to certain embodiments of the present disclosure.

FIG. 5 schematically shows a display cell structure according to certain embodiments of the present disclosure. Specifically, the display cell structure 500 as shown in FIG. 5 may also be used to replace the display cell structure as shown in FIG. 1. In other words, the display cell structure 500 as shown in FIG. 5 may be combined with the backlight module 110 as shown in FIG. 1 to form a display device.

As shown in FIG. 5, the display cell structure 500 includes more detailed component structures in comparison to the display cell structures 200 and 300 as shown in FIGS. 2 and 3. Specifically, the display cell structure 500 includes a first substrate 502 and a second substrate 504, which are spaced apart from each other. A common electrode layer 510 and a wire grid polarizer layer 520 are disposed between the first substrate 502 and the second substrate 504, dividing the space between the first substrate 502 and the second substrate 504 into two parts. Specifically, the wire grid polarizer layer 520 is disposed on the common electrode layer 510 and facing the second substrate 504. Further, a polarizer layer 550 is disposed on the second substrate 504 and facing an opposite side to the common electrode layer 510 and the wire grid polarizer layer 520. In this embodiment, the polarizer layer 550 faces the backlight. In other words, a backlight module (not shown) may be disposed to face the polarizer layer 550 and emit light toward the polarizer layer 550. In this case, the second display structure 540 would be located closer to the backlight module than the first display structure 530, and the light would pass through the second display structure 540, and then enter the first display structure 530.

The space between the first substrate 502 and the common electrode layer 510 forms a first cell gap 506, which is provided for a first display structure 530. In this embodiment, the first display structure 530 (which is on the top side of FIG. 5) functions as a light shutter section, which includes a first gate electrode 531, a first source electrode 532, a first drain electrode 533, a first pixel electrode 534, a first passivation layer 535, a polymer liquid crystal layer 536, a first black matrix layer 537, a first semiconductor oxide layer 538, a first gate insulating layer 560 and a first insulating layer 562. The first black matrix layer 537 is disposed on the first substrate 502. The first semiconductor oxide layer 538 is disposed on the first black matrix layer 537. The first gate insulating layer 560 is disposed on the first semiconductor oxide layer 538, and the first gate electrode 531 is a disposed on the first gate insulating layer 560, such that the first gate electrode 531 and the first semiconductor oxide layer 538 are insulated. The first source electrode 532 and the first drain electrode 533 are disposed on the first semiconductor oxide layer 538, and the first insulating layer 562 is provided between the first gate electrode 531, the first source electrode 532 and the first drain electrode 533, such that the first source electrode 532 and the first drain electrode 533 are insulated from the first gate electrode 531, thus forming a first TFT for the first display structure 530. The first drain electrode 533 is electrically connected to the first pixel electrode 534. On both sides of the first TFT, the first insulating layer 562 (which may be the same insulating material as the first gate insulating layer 560) is provided to further ensure insulation of the first source electrode 532 and the first drain electrode 533. The first passivation layer 535 (which may be the same insulating material as the first gate insulating layer 560 and the first insulating layer 562) is then provided to cover the first gate electrode 531, the first source electrode 532, the first drain electrode 533 and the first insulating layer 562. Then, the polymer liquid crystal layer 536 is disposed in the first cell gap 506, thus forming the first display structure 530. In certain embodiments, the first gate insulating layer 560, the first insulating layer 562 and the first passivation layer 535 may be formed by the same insulating material, or may be formed by different insulating materials.

The space between the second substrate 504 and the wire grid polarizer layer 520 forms a second cell gap 508, which is provided for a second display structure 540. In this embodiment, the second display structure 540 functions as a display section, which includes a second gate electrode 541, a second source electrode 542, a second drain electrode 543, a second pixel electrode 544, a second passivation layer 545, a liquid crystal layer 546, a first black matrix layer 547, a second semiconductor oxide layer 548, a second gate insulating layer 570, a second insulating layer 572, a plurality of color filters 580, a photo spacer 582, and two alignment layers 584 and 586. The second black matrix layer 547 is disposed on the second substrate 504. The second semiconductor oxide layer 548 is disposed on the second black matrix layer 547. The second gate insulating layer 570 is disposed on the second semiconductor oxide layer 548, and the second gate electrode 541 is a disposed on the second gate insulating layer 570, such that the second gate electrode 541 and the second semiconductor oxide layer 548 are insulated. The second source electrode 542 and the second drain electrode 543 are disposed on the second semiconductor oxide layer 548, and the second insulating layer 572 is provided between the second gate electrode 541, the second source electrode 542 and the second drain electrode 543, such that the second source electrode 542 and the second drain electrode 543 are insulated from the second gate electrode 541, thus forming a second TFT for the second display structure 540. The second drain electrode 543 is electrically connected to the second pixel electrode 544. On both sides of the second TFT, the second insulating layer 572 (which may be the same insulating material as the second gate insulating layer 570) is provided to further ensure insulation of the second source electrode 542 and the second drain electrode 543. The color filters 580 are disposed on the second insulating layer 572. The second passivation layer 545 (which may be the same insulating material as the second gate insulating layer 570 and the second insulating layer 572) is then provided to cover the second gate electrode 541, the second source electrode 542, the second drain electrode 543, the color filters 580 and the second insulating layer 572. In certain embodiments, the second gate insulating layer 570, the second insulating layer 572 and the second passivation layer 545 may be formed by the same insulating material, or may be formed by different insulating materials. The photo spacer 582 is formed between the common electrode layer 510 and one of the color filters 580. The alignment layer 584 is formed on the bottom of the second cell gap 508 to cover the surfaces of the passivation layer 545 and the second pixel electrode 544, and the alignment layer 586 is formed on the top of the second cell gap 508 to cover the surface of the wire grid polarizer layer 520. Then, the liquid crystal layer 546 is disposed in the second cell gap 508, thus forming the second display structure 540. The components of the second display structure 540, including the second source electrode 541, the second drain electrode 542, the second gate electrode 543, the second pixel electrode 544, the second semiconductor oxide layer 548 and the second black matrix layer 547, are aligned to the corresponding components of the first pixel electrode 534, including the first source electrode 532, the first drain electrode 533, the first gate electrode 531, the first pixel electrode 534, the first semiconductor oxide layer 538 and the first black matrix layer 537, along a direction substantially perpendicular to the wire grid polarizer layer 520 (which is the vertical direction as shown in FIG. 5).

FIG. 6A schematically shows a bottom view of a pixel structure of the first display structure according to certain embodiments of the present disclosure. Specifically, FIG. 6A shows the pixel structure 600' of one sub-pixel of the first display structure 530 in a bottom view. In other words, the pixel structure 600' as shown in FIG. 6A is obtained by viewing from the bottom of FIG. 5.

As shown in FIG. 6A, the pixel structure 600' of the first display structure 530 includes a first TFT 630 (which may be formed by the first gate electrode 531, the first source electrode 532 and the first drain electrode 533 as shown in FIG. 5). The first gate electrode of the first TFT 630 is electrically connected to a first gate line 631, which substantially extends along the horizontal direction as shown in FIG. 6A. The first source electrode of the first TFT 630 is electrically connected to a first source line 632, which substantially extends along the vertical direction as shown in FIG. 6A. The first drain electrode of the first TFT 630 is electrically connected to the first pixel electrode 634.

Figure 6B:
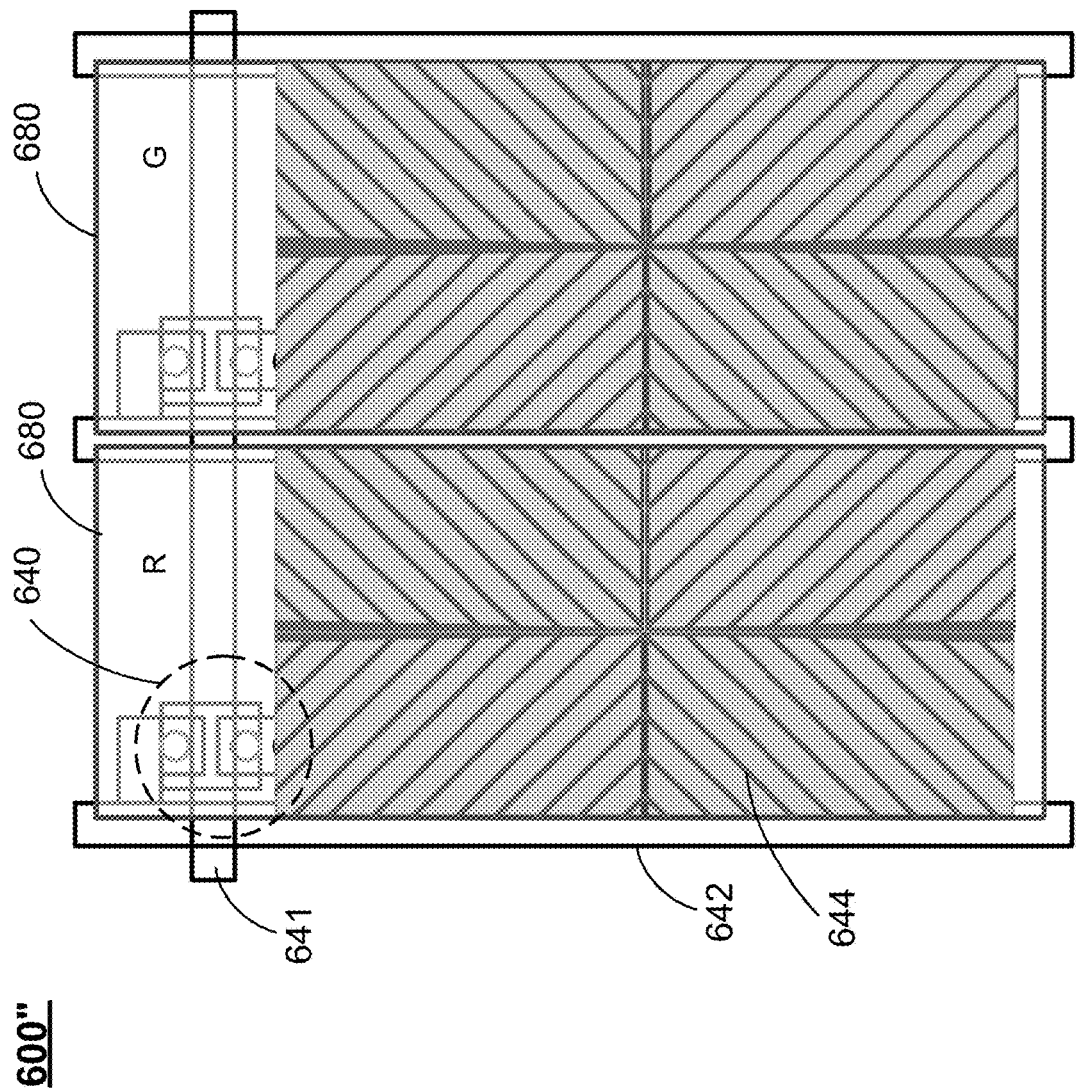
FIG. 6B schematically shows a top view of a pixel structure of the second display structure according to certain embodiments of the present disclosure.

FIG. 6B schematically shows a top view of a pixel structure of the second display structure according to certain embodiments of the present disclosure. Specifically, FIG. 6B shows the pixel structure 600" of two sub-pixels of the second display structure 540 in a top view. In other words, the pixel structure 600" as shown in FIG. 6B is obtained by viewing from the top of FIG. 5.

As shown in FIG. 6B, the pixel structure 600" of the second display structure 540 includes a second TFT 640 (which may be formed by the second gate electrode 541, the second source electrode 542 and the second drain electrode 543 as shown in FIG. 5). The second gate electrode of the second TFT 640 is electrically connected to a second gate line 641, which substantially extends along the horizontal direction as shown in FIG. 6B. The second source electrode of the second TFT 640 is electrically connected to a second source line 642, which substantially extends along the vertical direction as shown in FIG. 6B. The second drain electrode of the second TFT 640 is electrically connected to the second pixel electrode 644. In this embodiment, the second pixel electrode 644 has the pixel electrode structure for the VA mode. Further, in each of the sub-pixels, a color filter 680 is provided.

Figure 7:
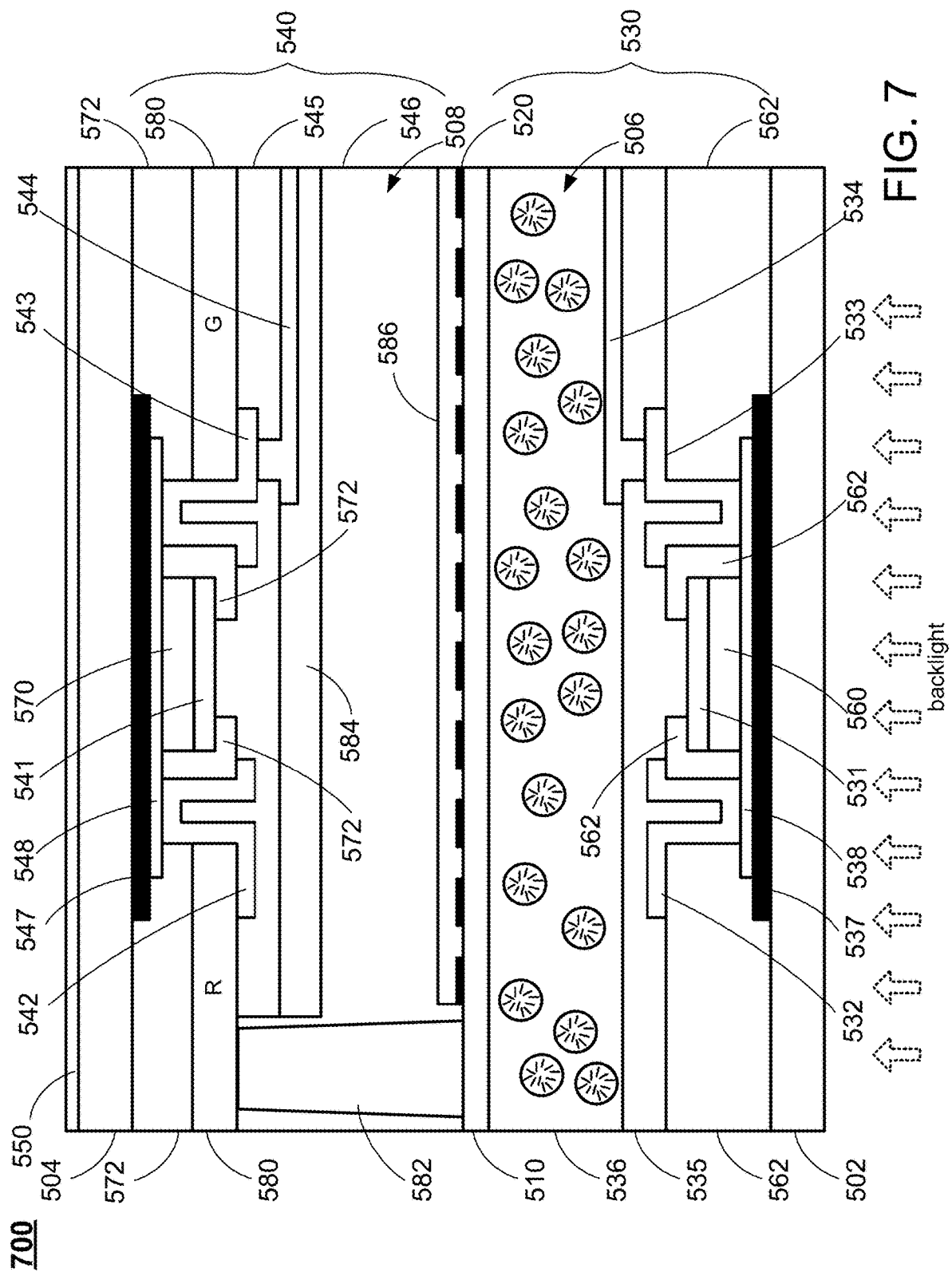
FIG. 7 schematically shows a display cell structure according to certain embodiments of the present disclosure, wherein the display cell structure is an inversed structure of the display cell structure as shown in FIG. 5.

FIG. 7 schematically shows a display cell structure according to certain embodiments of the present disclosure. Specifically, in this embodiment, the display cell structure 700 is an inversed structure of the display cell structure 500 as shown in FIG. 5, and all of the components in the display cell structure 700 are substantially identical to those of the display cell structure 500. The only difference in the display cell structure 700 as shown in FIG. 7 from the display cell structure 500 as shown in FIG. 5 exists in that, in this embodiment, the first substrate 502 faces the backlight. In other words, a backlight module (not shown) may be disposed to face the first substrate 502 and emit light toward the first substrate 502. In this case, the first display structure 530 would be located closer to the backlight module than the second display structure 540, and the light would pass through the first display structure 530, and then enter the second display structure 540. Details of the structures of the display cell structure 700 are not elaborated herein.

Figure 8:
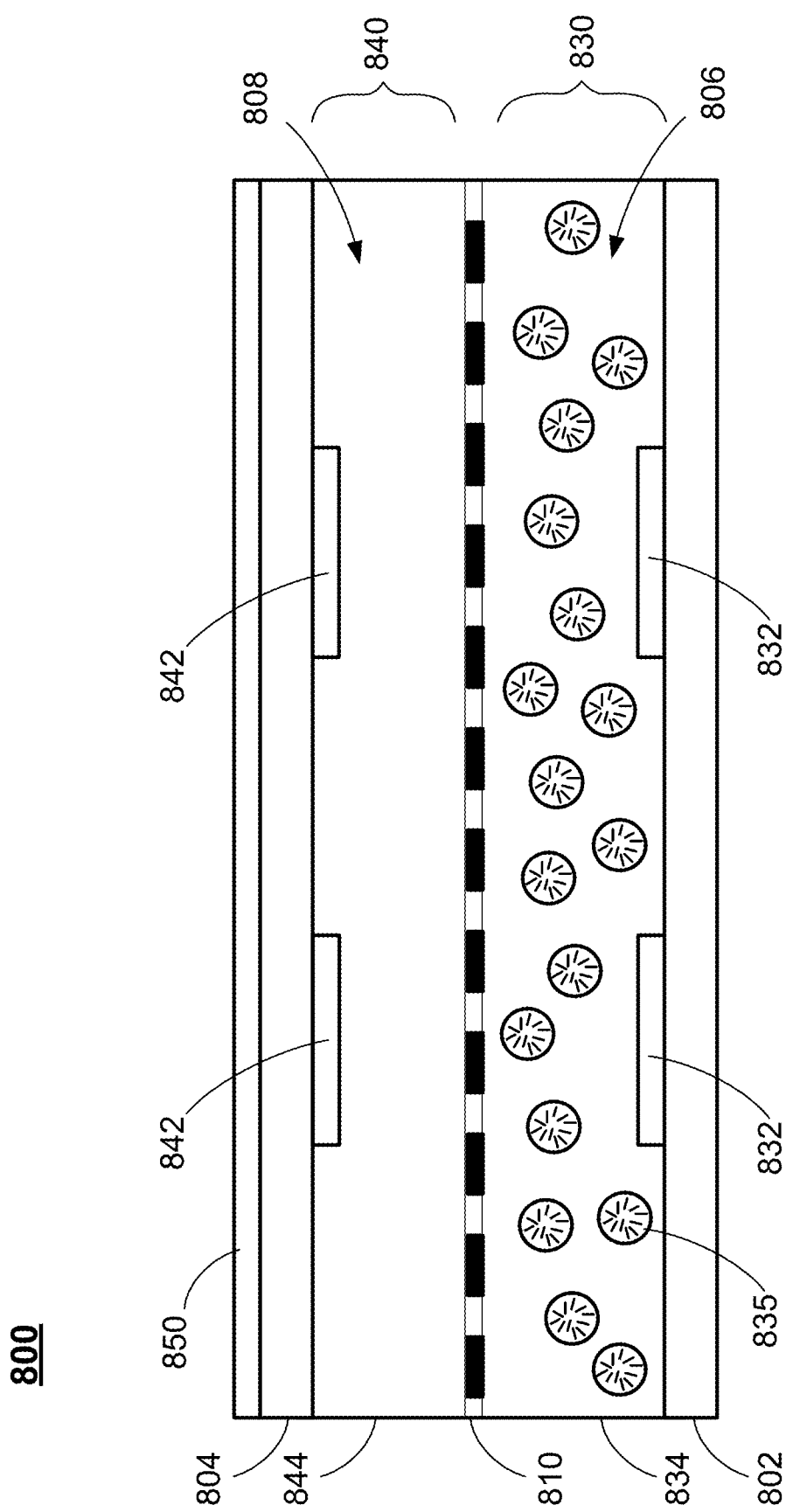
FIG. 8 schematically shows a display cell structure according to certain embodiments of the present disclosure.

FIG. 8 schematically shows a display cell structure according to certain embodiments of the present disclosure. Specifically, in this embodiment, the display cell structure 800 is substantially similar to the display cell structure as shown in FIG. 2. The only difference in the display cell structure 800 as shown in FIG. 8 from the display cell structure 200 as shown in FIG. 2 exists in that, in this embodiment, there is no common electrode layer, and there is only a wire grid polarizer layer 810 disposed between the first substrate 802 and the second substrate 804, dividing the space between the first substrate 802 and the second substrate 804 into the first cell gap 806 (for the first display structure 830) and the second cell gap 808 (for the second display structure 840). In this case, the wire grid polarizer layer 810 is formed by a low resistivity material to function as a common electrode, such that there is no need to provide a separate common electrode layer. It should be noted that the low resistivity material is defined as a material having an electrical resistivity smaller than $10^{-7}$ Ω·m. For example, the electrical resistivity of silver is about $1.59*10^{-8}$ Ω·m; the electrical resistivity of copper (Cu) is about $1.68*10^{-8}$ Ω·m; the electrical resistivity of aluminum (Al) is about $2.65*10^{-8}$ Ω·m; and the electrical resistivity of tungsten (W) is about $5.6*10^{-8}$ Ω·m. In certain embodiments, the low resistivity material may be selected from the group consisting of aluminum (Al), molybdenum (Mo), tungsten (W), or a combination thereof. Other components of the display cell structure 800, including the first pixel electrodes 832, the polymer liquid crystal layer 834, the second pixel electrodes 842, the liquid crystal layer 844, and the polarizer layer 850, are substantially identical to the corresponding components of the display cell structure 200 as shown in FIG. 2, including the first pixel electrodes 232, the polymer liquid crystal layer 234, the second pixel electrodes 242, the liquid crystal layer 244, and the polarizer layer 250. Thus, details of these structures of the display cell structure 800 are not elaborated herein.

Figure 9:
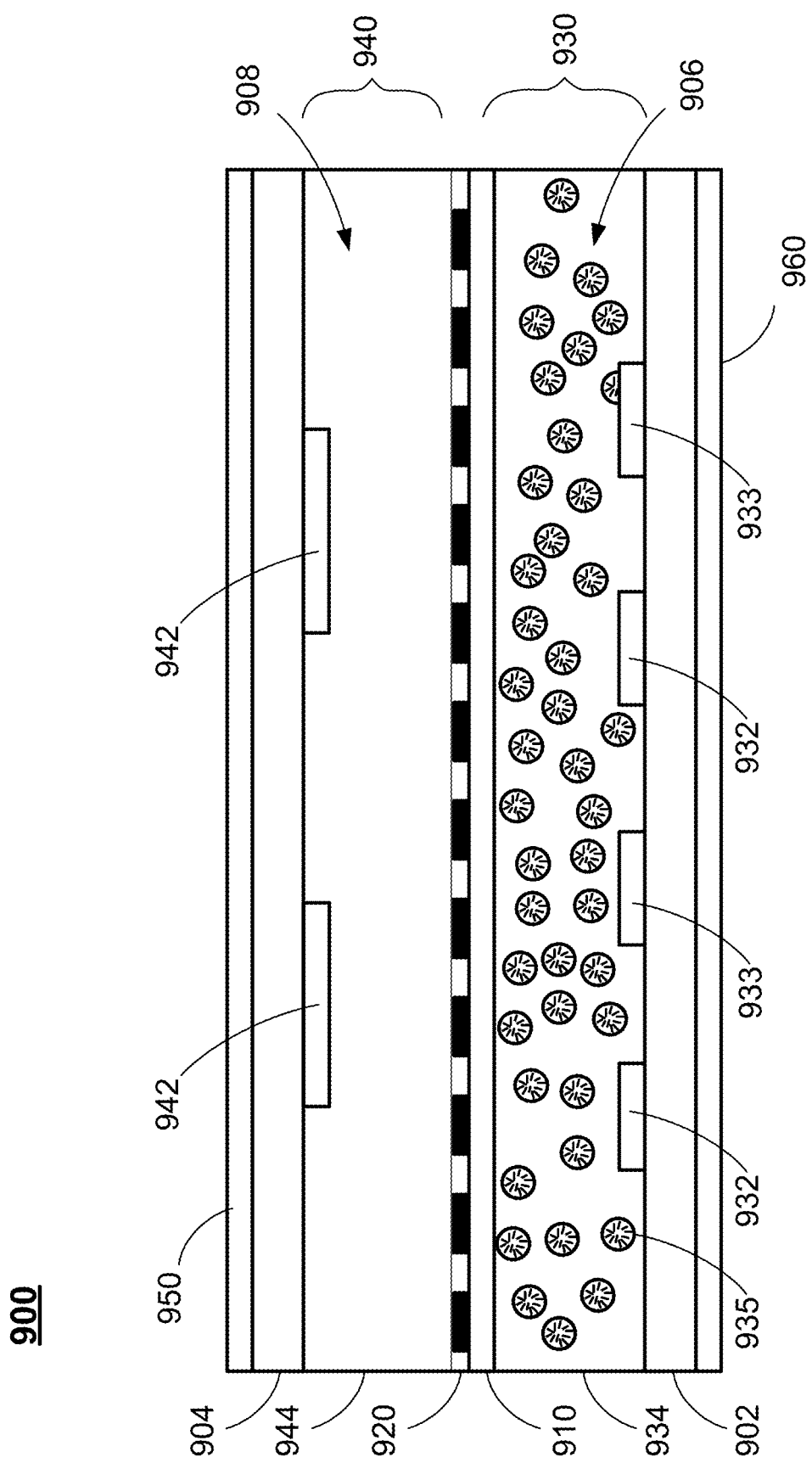
FIG. 9 schematically shows a display cell structure according to certain embodiments of the present disclosure.

FIG. 9 schematically shows a display cell structure according to certain embodiments of the present disclosure. Specifically, in this embodiment, the display cell structure 900 is substantially similar to the display cell structure as shown in FIG. 2. The only difference in the display cell structure 900 as shown in FIG. 9 from the display cell structure 200 as shown in FIG. 2 exists in that, in this embodiment, in the first display structure 930, a plurality of reference electrodes 933 may be provided in addition to the first pixel electrodes 932, such that the first pixel electrodes 932 and the reference electrodes 933 are alternately disposed on the first substrate 902. Further, a polarizer layer 960 is provided at the bottom of the first substrate 902. Moreover, the drop size of the liquid crystal molecules 935 in the polymer liquid crystal layer 934 is significantly smaller than the drop size of the liquid crystal molecules 235 as shown in FIG. 2. In certain embodiments, the drop size of the liquid crystal molecules 935 as shown in FIG. 9 may be smaller than 300 nm, and the drop size of the liquid crystal molecules 235 as shown in FIG. 2 may be greater than or equal to 300 nm. In certain embodiments, the first pixel electrodes 932 and the reference electrodes 933 can be formed on the first substrate 902 as the same electrode layer, thus forming an in-plane switching (IPS) structure. In certain embodiments, the first pixel electrodes 932 and the reference electrodes 933 can be formed by different electrode layers, thus forming a fringe field switching (FFS) structure. Other components of the display cell structure 900, including the second pixel electrodes 942, the liquid crystal layer 944, and the polarizer layer 950, are substantially identical to the corresponding components of the display cell structure 200 as shown in FIG. 2, including the second pixel electrodes 242, the liquid crystal layer 244, and the polarizer layer 250. Thus, details of these structures of the display cell structure 900 are not elaborated herein.

In operation of the display cell structure 900 as shown in FIG. 9, the first pixel electrodes 932 and the reference electrodes 933 are provided with different operational voltages, such that a lateral electric field is formed between each of the first pixel electrodes 932 and its adjacent reference electrode 933. With the lateral electric field provided by the first pixel electrodes 932 and the reference electrodes 933, as well as the polarizer layer 960, the lateral electric field (or, in the case where no voltage difference is applied between the first pixel electrodes 932 and the reference electrodes 933, no electric field is formed) may be used to control the orientation of the polymer liquid crystal molecules 935 (having the drop size smaller than 300 nm) of the polymer liquid crystal layer 934, such that the polymer liquid crystal layer 934 may be switchable between two operational modes to either allow the light entering the first display structure 930 to pass through the first display structure 930 or block the light from passing through the first display structure 930. In certain embodiments, the two operational modes of the first display structure 930 may include a first operational mode and a second operational mode. In the first operational mode, a voltage difference is applied between the first pixel electrodes 932 and the reference electrodes 933 to provide the lateral electric field, which may be used to control the orientation of the polymer liquid crystal molecules 935 of the polymer liquid crystal layer 934 to switch the first display structure 930 to the transparent state, allowing the light entering the first display structure 930 to pass through the first display structure 930. In the second operational mode, no voltage difference is applied between the first pixel electrodes 932 and the reference electrodes 933, and the first display structure 930 is configured to switch to a substantially opaque state, which does not allow the light to pass through the first display structure 930.

In certain embodiments, the display cell structure 900 as shown in FIG. 9 may be further varied, such that there is no common electrode layer, and there is only a wire grid polarizer layer disposed between the first substrate 902 and the second substrate 904 (which is similar to the structure as shown in FIG. 8). In this case, the wire grid polarizer layer may be formed by a low resistivity material to function as a common electrode, such that there is no need to provide a separate common electrode layer.

As discussed above, in each of the display cell structures according to certain embodiments of the disclosure, only two substrates are provided (instead of four substrates as shown in FIG. 1), which makes the display cell structure much lighter and cheaper. Further, the contrast ratio of the display cell structure is the multiple of the contrast ratios of the first display structure (i.e., the light shutter section) and the second display structure (i.e., the display section), which allows the total contrast ratio of the display cell structure to be greatly enhanced. Accordingly, the display cell structure, as well as the display device formed with the display cell structure, may achieve enhanced contrast ratio with significantly reduced weight, volume and cost.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display cell structure, comprising:
    a first substrate and a second substrate spaced apart from each other;
    a wire grid polarizer layer disposed between the first substrate and the second substrate, forming a first cell gap between the first substrate and the wire grid polarizer layer and a second cell gap between the second substrate and the wire grid polarizer layer;
    a common electrode layer disposed between the first substrate and the second substrate, wherein the wire grid polarizer layer is directly disposed on the common electrode layer;
    a first display structure disposed in the first cell gap between the first substrate and the wire grid polarizer layer, the first display structure comprising:
        a plurality of first pixel electrodes disposed on the first substrate and facing the wire grid polarizer layer; and
        a polymer liquid crystal layer disposed in the first cell gap between the first substrate and the wire grid polarizer layer;
    a polarizer layer disposed on the second substrate and facing an opposite side to the wire grid polarizer layer; and
    a second display structure disposed in the second cell gap between the second substrate and the wire grid polarizer layer, the second display structure comprising:
        a plurality of second pixel electrodes disposed on the second substrate and facing the wire grid polarizer layer; and
        a liquid crystal layer disposed in the second cell gap between the second substrate and the wire grid polarizer layer,
    wherein the common electrode layer functions as a shared common electrode for both the first display structure and the second display structure.

2. The display cell structure of claim 1, wherein the wire grid polarizer layer is disposed on the common electrode layer and facing the second display structure.

3. The display cell structure of claim 1, wherein the wire grid polarizer layer is formed by a low resistivity material to function as a common electrode, and wherein the low resistivity material has an electrical resistivity smaller than $10^{-7}$ Ω·m.

4. The display cell structure of claim 3, wherein the low resistivity material is selected from the group consisting of aluminum (Al), Molybdenum (Mo), Tungsten (W), or a combination thereof.

5. The display cell structure of claim 1, wherein a thickness of the wire grid polarizer layer is 80-120 nm.

6. The display cell structure of claim 1, wherein the second display structure is in a vertically-aligned (VA) mode or a twisted nematic (TN) mode.

7. The display cell structure of claim 1, wherein the first display structure and the second display structure correspondingly define a plurality of pixels, and for each of the pixels, in a first operational mode, the first display structure is configured to switch to a transparent state, and in a second operational mode, the first display structure is configured to switch to a substantially opaque state.

8. The display cell structure of claim 7, wherein for each of the pixels, in the first operational mode, the first pixel electrode corresponding to the pixel is provided with a voltage difference, such that the first display structure is configured to switch to the transparent state, and in the second operational mode, the first pixel electrode corresponding to the pixel is not provided with the voltage difference, such that the first display structure is configured to switch to the substantially opaque state.

9. The display cell structure of claim 1, wherein the first display structure and the second display structure correspondingly define a plurality of pixels, and for each of the pixels, the second display structure comprises a plurality of color filters disposed on the second substrate, wherein each of the second pixel electrodes corresponds to one of the color filters to form a sub-pixel.

10. The display cell structure of claim 9, wherein for each of the sub-pixels, the first display structure further comprises:
    a first transistor electrically connected to a corresponding one of the first pixel electrodes, each of the first transistors comprising:
        a first semiconductor layer disposed on the first substrate;
        a first gate insulating layer disposed on the first semiconductor layer;
        a first gate electrode disposed on the first gate insulating layer;
        a first source electrode and a first drain electrode disposed on the first semiconductor layer and insulated from the first gate electrode,
    wherein the first drain electrode is electrically connected to the corresponding one of the first pixel electrodes; and
    a first black matrix layer disposed between the first transistor and on the first substrate.

11. The display cell structure of claim 10, wherein for each of the sub-pixels, the second display structure further comprises:
    a second transistor electrically connected to a corresponding one of the second pixel electrodes, each of the second transistors comprising:
        a second semiconductor layer disposed on the second substrate;
        a second gate insulating layer disposed on the second semiconductor layer;
        a second gate electrode disposed on the second gate insulating layer;
        a second source electrode and a second drain electrode disposed on the second semiconductor layer and insulated from the second gate electrode, wherein the second drain electrode is electrically connected to the corresponding one of the second pixel electrodes; and
    a second black matrix layer disposed between the second transistor and on the second substrate, and between the color filters.

12. The display cell structure of claim 1, wherein the first display structure further comprises a plurality of reference electrodes disposed on the first substrate and facing the wire grid polarizer layer, and the first pixel electrodes and the reference electrodes are alternately disposed on the first substrate.

13. A display cell structure, comprising:
    a first substrate and a second substrate spaced apart from each other;
    a wire grid polarizer layer disposed between the first substrate and the second substrate, forming a first cell gap between the first substrate and the wire grid polarizer layer and a second cell gap between the second substrate and the wire grid polarizer layer;
    a first display structure disposed in the first cell gap between the first substrate and the wire grid polarizer layer, the first display structure comprising:

a plurality of first pixel electrodes disposed on the first substrate and facing the wire grid polarizer layer; and a polymer liquid crystal layer disposed in the first cell gap between the first substrate and the wire grid polarizer layer;

a common electrode layer disposed between the first substrate and the second substrate, wherein the wire grid polarizer layer is disposed on the common electrode layer and facing the second display structure;

a polarizer layer disposed on the second substrate and facing an opposite side to the wire grid polarizer layer; and a second display structure disposed in the second cell gap between the second substrate and the wire grid polarizer layer, the second display structure comprising:

a plurality of second pixel electrodes disposed on the second substrate and facing the wire grid polarizer layer; and a liquid crystal layer disposed in the second cell gap between the second substrate and the wire grid polarizer layer, wherein there are only the wire grid polarizer layer and the common electrode layer between the first display structure and the second display structure.

14. The display cell structure of claim 13, wherein the common electrode layer is formed by indium tin oxide.

15. The display cell structure of claim 13, wherein the wire grid polarizer layer is formed by a low resistivity material to function as a common electrode, and wherein the low resistivity material has an electrical resistivity smaller than $10^{-7}$ Ω·m.

16. The display cell structure of claim 13, wherein a thickness of the wire grid polarizer layer is 80-120 nm.

* * * * *